Nov. 28, 1961 H. S. FEDER 3,011,074

TRANSISTOR BILATERAL SWITCHING CIRCUIT

Filed April 21, 1959

INVENTOR
H. S. FEDER
BY Kenneth B. Hamlin
ATTORNEY 3,011,074

TRANSISTOR BILATERAL SWITCHING CIRCUIT

Herbert S. Feder, Fanwood, N.J., assignor to Bell Telephone Laboratories, Incorporated, New York, N.Y., a corporation of New York Filed Apr. 21, 1959, Ser. No. 807,901
8 Claims. (Cl. 307—88.5)

Figure 1:
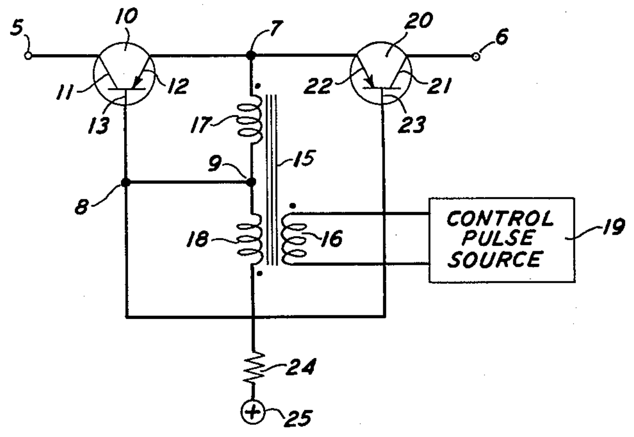

This invention relates to electrical switching circuits and more specifically to electronic gating circuits employing semiconductor devices.

With the advent of high-speed electrical systems, the need has arisen for electronic gating or switching circuits capable of exhibiting very fast response times. It is desirable that these gating circuits have the characteristics of essentially infinite impedance to current flow when in the nonconducting state and of essentially zero impedance to current flow when in the conducting state. Further, it is desirable that these gating circuits require very low power for control purposes and that the control circuitry be isolated from the signal transmission path. It is, accordingly, a general object of this invention to improve electronic gating circuits.

Applications for high-speed gating circuits exist in data processing systems, telegraph communication systems, television receiving systems, telephone switching systems, and other high-speed electrical systems. Many of the applications require the gating circuits to be adapted to bilateral signal transmission. It is known in the art that a two-transistor gate, controlled by the application of signals between the bases and the emitters of each transistor, is suitable for bilateral signal transmission. Such a gating network is disclosed in Patent 2,899,570 of J. D. Johannesen, P. B. Myers and J. E. Schwenker, granted August 11, 1959.

For use in many electrical systems, two-transistor gates, of the configuration disclosed in the above-mentioned application, do not exhibit sufficiently rapid switching from the conducting state to the nonconducting state; that is, the turn-off time of the gate is too slow. When the gate has been switched to the low impedance or conducting state, it will remain there as long as the base regions can supply the collector junctions with an adequate supply of minority carriers. When the supply of minority carriers to the base regions stops, the gate begins to turn off to the high impedance state. The turn-off time is increased by the phenomenon of "carrier storage." In a known system, the turn-off time of the gate is reduced by providing a turn-off pulse of opposite polarity to and immediately proceeding the turn-on pulse. The turn-off pulse establishes a field in the base regions in such a direction that the minority carriers are swept away from the collector junctions. The use of both turn-on and turn-off pulses, however, increases the complexity of the control circuitry.

Accordingly, it is an object of this invention to provide an improved high-speed gating circuit.

More specifically, it is an object of this invention to provide an improved high-speed gating circuit capable of bilateral signal transfer.

It is a further object of this invention to provide a high-speed gating circuit capable of presenting essentially zero impedance to current flow in either direction when in a conducting state and essentially infinite impedance to current flow in either direction when in a nonconducting state.

It is a further object of this invention to provide a high-speed gating circuit wherein the control signals are effectively isolated from the signal paths.

It is a still further object of this invention to provide a high-speed gating circuit capable of very fast switching from a conducting state to a nonconducting state.

It is another object of this invention to provide a high-speed gating circuit requiring very low control power.

These and other objects are attained in illustrative embodiments of the present invention wherein a gating circuit comprises a pair of transistors of like conductivity types connected back-to-back; that is, the emitters and the bases of the transistors are individually interconnected. The collector electrodes of the two transistors thus provide the terminals of the gate for bilateral signal transmission. Control signals are applied to the primary of a pulse transformer, the secondary of which is connected between the emitters and the bases of the transistors, to switch the impedance state of the transistors.

In accordance with one aspect of the present invention, a source of bias potential is connected to the bases of the transistors through a tertiary winding on the pulse transformer. The tertiary winding provides regenerative feedback to improve substantially the operational characteristics of the gating circuit.

Another aspect of the present invention is directed to the use of trigger pulses to control the impedance state of the gating circuit. The gate is switched to the conducting state on application of a trigger pulse to the primary winding of the transformer and remains in that state for a period of time determined by the parameters of the gating circuit.

Accordingly, it is a feature of my invention that a switching circuit include a pair of back-to-back transistors serially connected in the signal transmission path, a source of control signals for selectively changing the impedance state of the transistors, and feedback circuitry for reducing the switching times and control power requirements of the switching circuit.

It is a further feature of this invention that transformer means be included for inductive coupling of control signals and feedback signals to the transistors.

Figure 2:
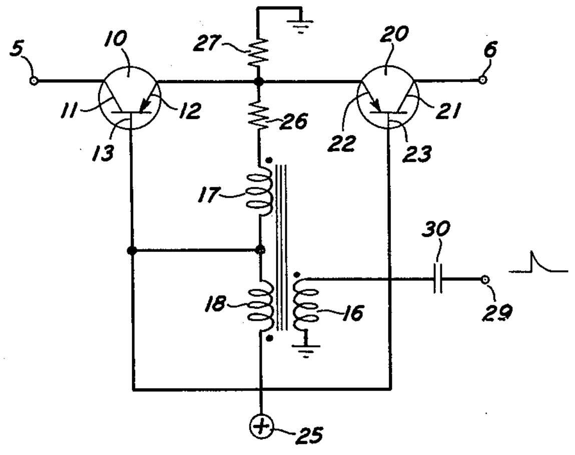

These and other objects and features of this invention will be better understood upon consideration of the following detailed description and the accompanying drawing, in which:

FIG. 1 is an illustrative embodiment employing the principles of my invention; and FIG. 2 is an alternative illustrative embodiment of my invention.

Referring now to FIG. 1 of the drawing, a basic illustrative embodiment is shown comprising a pair of transistors 10 and 20, which may be advantageously of the alloy junction type, connected back-to-back between terminal points 5 and 6, and a pulse transformer 15 having windings 16, 17 and 18. The emitters 12 and 22 of transistors 10 and 20, respectively, are directly interconnected through connection point 7. Similarly, bases 13 and 23 of transistors 10 and 20, respectively, are directly interconnected through connection point 8. The collector 11 of transistor 10 is connected to terminal 5 and the collector 21 of transistor 20 is connected to terminal 6.

Control signals are applied to primary winding 16 of transformer 15 from control pulse source 19, and are coupled to the transistors through secondary winding 17 which is connected between connection points 7 and 9. Connection point 9 is directly interconnected to connection point 8. Tertiary winding 18 of transformer 15 is connected between connection point 9 and source of potential 25 through resistor 24. It will be noted that windings 16, 17 and 18 are wound on a common core of transformer 15 and are poled as indicated in the drawing.

As is well known in the art, transistors can exhibit virtually zero impedance or a very high impedance depending upon the bias voltage. For example, considering a P-N-P transistor, a positive base bias voltage switches the transistor into the high impedance of nonconducting state. Conversely, a negative base bias voltage of sufficient magnitude switches the transistor into the low impedance or conducting state. Naturally, considering an N-P-N transistor, the polarity of the base bias voltage to achieve a particular impedance state would be the reverse of that required for the P-N-P transistor. Although either P-N-P or N-P-N transistors may be used advantageously in this invention, the use of P-N-P transistors, as shown in FIG. 1, will be assumed for purposes of describing the invention.

For purposes which become apparent hereinafter, the magnitude of potential source 25 is advantageously selected to be greater than the peak magnitude of signals at terminals 5 and 6. Hence, in the absence of a control pulse from source 19, direct current from source 25 through resistor 24 will bias the gate in its high impedance state. For signals of either polarity at terminals 5 and 6, the collector junctions of transistors 10 and 20 will be reverse-biased. Therefore, the gate presents a high impedance serially connected between terminal 5 and terminal 6 and is considered in the "open" condition. If the magnitude of the potential of source 25 were smaller than the peak magnitude of the signals at terminals 5 and 6, only one of the collector junctions would be reverse-biased, depending upon the polarity of the signals, and the resulting series impedance to signal flow would be correspondingly smaller.

The gate circuit is "closed," presenting a very low impedance to signal flow between terminals 5 and 6, by the application of a positive-going pulse to primary winding 16 from control pulse source 19. Pulse source 19 may include any of the known pulse generation circuitry and, depending upon the application wherein the gating circuit is used, may include logic circuitry to apply the pulse to close the gate during discrete periods of time to sample or transmit information. For example, this invention may be used advantageously in a time division telephone switching network wherein the gate is closed for two microseconds out of every one hundred and twenty-five microseconds to sample information from a communication terminal and transfer it to a common communication link.

When a control pulse is applied to primary winding 16, current is produced in secondary winding 17 which divides at connection point 7 and is injected into the base regions of transistors 10 and 20. This floods the base regions with minority carriers and reduces the impedance of the collector junctions of transistors 10 and 20. As the impedance of the collector junctions decreases, the current flowing from source 25 through resistor 24 and tertiary winding 18 increases in magnitude. The resulting increase in current in winding 18 is reflected in winding 17 in such a direction as to further decrease the impedance of the collector junctions by driving transistors 10 and 20 deeper into saturation. Clearly, therefore, the control signal power required to switch transistors 10 and 20 to their low impedance states is substantially reduced by the regenerative feedback action of tertiary winding 18. In particular, in an illusrative circuit the use of tertiary winding 18 reduced the control power requirements by a factor of ten. This, of course, permits the use of simpler and less costly control drive circuitry.

The gate will remain in its low impedance state as long as the base regions can supply the collector junctions with an adequate supply of minority carriers. The supply of minority carriers will terminate when current ceases to flow in secondary winding 17 or when the control pulse on primary winding 16 ends. At this point the remaining minority carriers are lost through recombination, used by signal current flowing through the gate, or are swept out as described hereinafter.

This latter sweeping-out is attained in the present invention through the action of tertiary winding 18. As the transistors 10 and 20 move out of saturation, upon cessation of the control pulse, the impedance of the collector junctions increases, resulting in a corresponding decrease in the current flowing from source 25 through tertiary winding 18. This decrease is reflected in secondary winding 17 which establishes a field in the base regions of transistors 10 and 20 in such a direction that the minority carriers are swept away from the collector junctions. Thus, the regenerative feedback action of winding 18 assists in turning off the gate more rapidly. In many applications the turn-off time of the gate is especially critical, such as in relation to the scanning frequency in systems where one terminal of the gate is tied to a common circuit. Therefore, positive deactivation of the gate, such as contemplated in this invention, becomes necessary to oppose the phenomenon referred to hereinbefore as "carrier storage."

It is advantageous that the impedance between source 25 and the bases of transistors 10 and 20 be quite small for purposes of maximum attenuation when the gate is in the nonconducting state. However, it is also advantageous that this impedance be quite large for purposes of minimum insertion loss when the gate is in the conducting state. In the embodiment of FIG. 1, this impedance includes tertiary winding 18 and resistor 24. By designing pulse transformer 15 such that tertiary winding 18 provides the desired amount of feedback without resistor 24, this resistance can be eliminated, resulting in an increase in attentuation when the gate is "open." Thus, when the gate is in the nonconducting state, winding 18 presents a very low impedance between source of potential 25 and the bases of transistors 10 and 20. Further, if the period of time that the gate is in the conducting state is sufficiently small, winding 18 presents a very high impedance to the input signal, causing the input signal to be transferred with essentially no loss of energy.

The instant invention can be controlled advantageously by an input trigger of negligible power. The trigger pulse switches the gate to the conducting state for a period of time determined by the parameters of the circuit, after which the gate switches back to the nonconducting state. The use of an input trigger greatly reduces the control power requirements and simplifies the control circuitry.

A gate circuit in accordance with the present invention employing an input trigger for control purposes is shown in FIG. 2. The circuit in FIG. 2 is an alternative illustrative embodiment of the circuit shown in FIG. 1, and elements in FIG. 2 corresponding to elements in the circuit of FIG. 1 are referred to by like reference numerals. Transistors 10 and 20 are connected back-to-back in a manner substantially identical to that shown in FIG. 1. Terminals 5 and 6 provide the signal path connection points, as in the circuit of FIG. 1.

Circuit differences include resistor 26, connected between secondary winding 17 and the emitters of transistors 10 and 20, and resistor 27, connected between the emitters and ground potential, to provide a negative bias between the emitters and the bases of transistors 10 and 20. Positive-going input trigger pulses are applied to primary winding 16 through terminal point 29 and capacitor 30.

The operation of the circuit of FIG. 2 is substantially identical to the operation of the circuit of FIG. 1. The application of a trigger pulse at terminal point 29 establishes a current in secondary winding 17 which injects minority carriers into the base regions of transistors 10 and 20. Regenerative feedback action promoted by tertiary winding 18 accelerates the switching of the gate toward a low impedance state.

When transistors 10 and 20 reach saturation, the current in secondary winding 17 is still increasing due to the regenerative coupling. At some point this current begins to decrease due to the inductance of transformer 15. The current continues to decrease until the collector current of transistor 10 equals the product of the base current times the current gain of transistor 10 or the collector current of transistor 20 equals the product of the base current times the current gain of transistor 20, bringing the transistors out of saturation. As transistors 10 and 20 switch toward their nonconducting states, the impedance of the collector junctions increases. Tertiary winding 18 reflects this change into secondary winding 17 in such a direction as to sweep the minority carriers from the base regions, thus assisting transistors 10 and 20 in switching to their high impedance states.

The gating circuit remains in the "open" condition until the application of the next input trigger at terminal 29. Potential developed across resistor 26 by current flow from source 25 reverse biases the emitter junctions of transistors 10 and 20 into their high impedance states. In a manner similar to that discussed in connection with FIG. 1, the collector junctions of the transistors are reverse-biased into their high impedance states by source 25. Therefore, for pulses of either polarity at terminals 5 and 6, the gating circuit presents a very high impedance serially connected in the signal transmission path.

Although my invention has been described with particular reference to two transistors of like conductivity types connected back-to-back, it is to be understood that this gate can be fabricated advantageously as a single unit. The single unit may advantageously include a pair of distinct collectors of similar conductivity types, a distinct base and emitter means, the collectors defining with the base a pair of collector junctions and the emitter means defining with the base at least one emitter junction.

What is disclosed hereinabove, therefore, is a high-speed gate comprising semiconductor units in a novel circuit arrangement which permits low power pulse or trigger control for very low impedance bilateral signal transmission with rapid turn-off to a high impedance blocking condition.

It is to be understood that the above-described arrangements are illustrative of the application of the principles of the invention. Numerous other arrangements may be devised by those skilled in the art without departing from the spirit and scope of this invention.

What is claimed is:

1. A switching circuit comprising a pair of similar conductivity type transistors each having an emitter, a base and a collector, said bases being connected together and said emitters being connected together, a first transmission line connection to the collector of one of said transistors, a second transmission line connection to the collector of the other of said transistors, a source of potential, a source of control signals, and a transformer having first, second and third windings, said first winding connected to said source of control signals, said second winding connected between said emitters and said bases of said transistors, said third winding connected between said bases and said source of potential.

2. A gating circuit comprising a pair of transistors each having a base, a collector and an emitter, a first conductor interconnecting said bases, a second conductor interconnecting said emitters, a first line terminal connected to the collector of one of said transistors, a second line terminal connected to the collector of the other of said transistors, a source of potential, a transformer having a primary, a secondary and a tertiary winding each having two terminals, one terminal of said secondary winding connected to said first conductor and the other terminal of said secondary winding connected to said second conductor, one terminal of said tertiary winding connected to said first conductor and the other terminal of said tertiary winding connected to said source of potential, and means for applying the control signals to said primary winding.

3. A gating circuit comprising a first and a second conductor, a first and a second transistor each having an emitter, a base and a collector, said collectors connected to said first and second conductors, a third conductor connecting said emitters, a fourth conductor connecting said bases, a source of potential, a transformer having first, second and third windings, said first winding connected between said third and fourth conductors, said second winding connected between said fourth conductor and said source of potential, and means for applying control signals to said third winding for transferring electrical signals from one of said first and second conductors to the other of said first and second conductors.

4. A switching circuit for transferring electrical signals from a first point to a second point in response to control signals comprising a first and a second transistor each having an emitter, a base and a collector, said bases being conductively connected and said emitters being conductively connected, said collectors being connected to said first and second points, respectively, a source of potential, a transformer having first, second and third windings, said first winding being connected between said emitters and said bases of said transistors, said second winding connected between said bases and said source of potential, and means for applying control signals to said third winding.

5. A switching circuit comprising a pair of transistors each having an emitter, a base and a collector, said bases being directly interconnected, said emitters being directly interconnected, a first terminal of a transmisison line connected to the collector of one of said transistors, a second terminal of a transmission line connected to the collector of the other of said transistors, biasing means connected to said emitters and said bases of said transistors, a source of control signals, and a transformer having first, second and third windings, said first winding connected to said source of control signals, said second winding connected to said bases of said transistors, said third winding connected between said emitters and said bases of said transistors.

6. A switching circuit comprising a first and a second conductor, a first and a second transistor each including an emitter, a collector and a base, said collector of said first transistor connected to said first conductor, said collector of said second transistor connected to said second conductor, said emitters of said transistors being directly interconnected, said bases of said transistors being directly interconnected, controlling means connected between said emitters and said bases of said transistors for selectively switching the impedance state of said transistors, a source of potential, and feedback promoting means connected between said bases of said transistors and said source of potential to provide regenerative coupling between said transistors and said controlling means.

7. A gating circuit comprising a serial signal path including transistor means defining a first junction having a normally high impedance to signals of one polarity and a second junction having a normally high impedance to signals of the opposite polarity, control means for supplying minority carriers in the vicinity of said junctions to reduce them to their low impedance states for signals of both polarities, said control means comprising a transformer having a first winding and a second winding, a source of control signals and means connecting said source to said first winding, and feedback means for sweeping the minority carriers from the vicinity of said junctions to return them to their respective high impedance states for signals of both polarities, said feedback means comprising a third winding on said transformer.

8. A gating circuit comprising a pair of transistors each having a base, a collector and an emitter, a first conductor interconnecting said emitters, a second conductor interconnecting said bases, a first connection to the collector of one of said transistors, a second connection to the collector of the other of said transistors, a source of potential, a first resistor connected between said first conductor and ground potential, a second resistor connected to said first conductor, a transformer having primary, secondary and tertiary windings, said secondary winding connected between said second resistor and said second conductor, said tertiary winding connected between said second conductor and said source of potential, and means for applying control signals to said primary winding.

References Cited in the file of this patent

UNITED STATES PATENTS

| | | |
|---|---|---|
| 2,809,303 | Collins | Oct. 8, 1957 |
| 2,843,743 | Hamilton | July 15, 1958 |
| 2,899,571 | Myers | Aug. 11, 1959 |